(12) United States Patent
Ivanov et al.

(10) Patent No.: US 7,411,453 B1
(45) Date of Patent: Aug. 12, 2008

(54) TAIL-CURRENT STEERING CIRCUIT AND METHOD FOR RAIL-TO-RAIL OPERATIONAL AMPLIFIER INPUT STAGE

(75) Inventors: Vadim V. Ivanov, Tucson, AZ (US); David R. W. Spady, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 11/655,524

(22) Filed: Jan. 19, 2007

(51) Int. Cl.
*H03F 3/45* (2006.01)

(52) U.S. Cl. ............... 330/261; 330/257; 330/258; 330/260

(58) Field of Classification Search ............ 330/261, 330/257, 258, 260
See application file for complete search history.

(56) References Cited

U.S. PATENT DOCUMENTS

| | | | |
|---|---|---|---|
| 5,311,145 A | 5/1994 | Huijsing et al. | 330/255 |
| 5,392,003 A * | 2/1995 | Nag et al. | 330/254 |
| 6,265,941 B1 * | 7/2001 | Lopata | 330/258 |
| 6,366,169 B1 * | 4/2002 | Ivanov | 330/255 |
| 6,972,706 B2 * | 12/2005 | Snoeijs | 341/158 |
| 7,196,581 B2 * | 3/2007 | Gammie et al. | 330/259 |
| 7,342,450 B2 * | 3/2008 | Jones | 330/253 |

* cited by examiner

*Primary Examiner*—Patricia Nguyen
(74) *Attorney, Agent, or Firm*—Wade J. Brady, III; Frederick J. Telecky, Jr.

(57) ABSTRACT

An amplifier includes first and second pairs of differentially coupled input transistors. The first current mirror generates a reference current which is mirrored by a second current mirror to produce a mirrored reference current. Current steering circuitry steers the mirrored reference current as a first tail current through the first pair when a common mode voltage associated with a differential input voltage exceeds a first reference voltage. A first portion of the mirrored reference current flows from the first current steering circuitry when the common mode voltage is greater than the first reference voltage to produce a second tail current for the second pair. A second portion of the mirrored reference current is fed back to an output of the first current mirror and summed with the reference current so as to reduce the second portion when the common mode voltage is greater than the first reference voltage.

18 Claims, 6 Drawing Sheets

TAIL-CURRENT STEERING CIRCUIT AND METHOD FOR RAIL-TO-RAIL OPERATIONAL AMPLIFIER INPUT STAGE

BACKGROUND OF THE INVENTION

The present invention relates generally to rail-to-rail operational amplifiers, and more particularly to improved circuitry for avoiding excess bias current in circuitry which generates tail currents for opposite-conductivity pairs of differentially coupled input transistors when the common mode input voltage is at a high level.

U.S. Pat. No. 5,311,145, issued May 10, 1984 entitled "Combination Driver-Summing Circuit for Rail-to-Rail Differential Amplifier" by Huijsing et al. is believed to be generally indicative of the closest prior art. A "rail-to-rail" operational amplifier is one which has the capability of operating with its common mode input voltage having a value anywhere between the upper and lower power supply voltage rails. In order to achieve a rail-to-rail common-mode input voltage range of an operational amplifier without the use of a charge pump, two pairs of opposite-conductivity inserted after noise input transistors are needed, namely a pair of a N-channel input transistors for operation with the common mode input voltage near the upper power supply voltage and a pair of P-channel input transistors for operation with the common mode input voltage near the lower power supply voltage. The circuit shown in "Prior Art" FIG. 1, which is similar to circuitry in the above-mentioned Huijsing et al. patent, is typically used in order to control the separate tail currents for the N-channel pair of input transistors and the P-channel pair of input transistors so as to maintain their composite transconductance $g_m$ at a relatively constant value. This is desirable in order to achieve a relatively constant bandwidth, phase margin, and noise level of the operational amplifier over its common mode input range.

Figure 1:
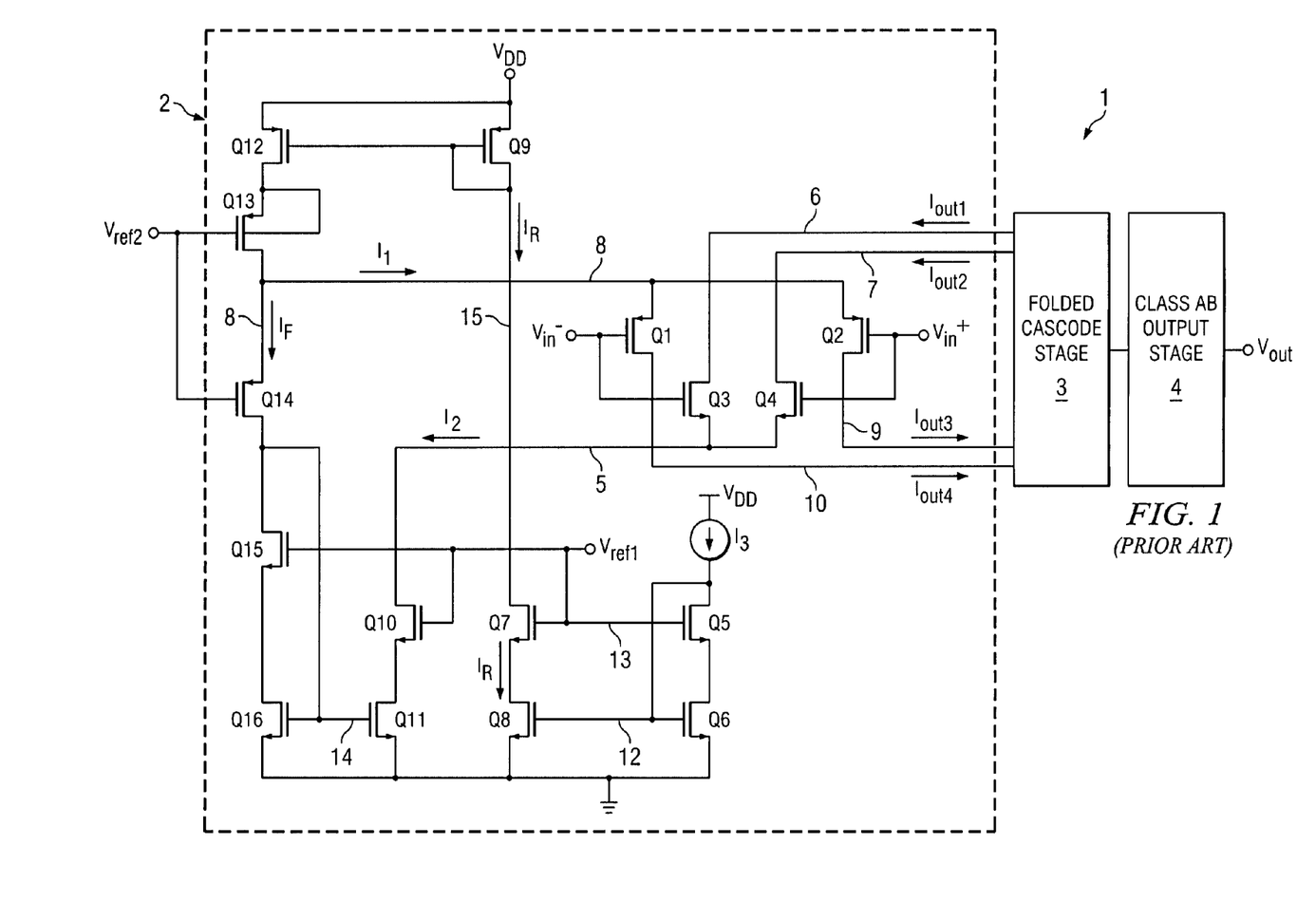
FIG. 1 is a schematic diagram of the closest prior art.

Referring to "Prior Art" FIG. 1, rail-to-rail operational amplifier 1 includes an input stage 2 which includes two pairs of differentially coupled opposite-conductivity input transistors and circuitry for generating their tail currents. The outputs of input stage 2 are coupled to inputs of a conventional folded cascode stage 3. The output of folded cascode stage 3 can be coupled to the input of a conventional class AB output stage 4. More specifically, input stage 2 includes a first differentially coupled pair of P-channel input transistors Q1 and Q2 having their sources connected by conductor 8 to receive a first tail current $I_1$ and also includes a second differentially coupled pair of N-channel input transistors Q3 and Q4 having their sources connected by conductor 5 to receive a second tail current $I_2$. A differential input voltage $Vin^+-Vin^-$ is coupled between the gate electrodes of P-channel input transistors Q1 and Q2 and also is coupled between the gate electrodes of N-channel input transistors Q2 and Q4. The drains of input transistors Q1-Q4 are coupled to corresponding input terminals of folded cascode stage 3. The rest of the circuitry shown in input stage 2 produces the two tail currents $I_1$ and $I_2$.

A reference current $I_R$ is generated in transistor Q8 and flows through cascode transistor Q7, conductor 15, and current mirror control transistor Q9. This causes a corresponding current to flow through current mirror output transistor Q12 and cascode transistor Q13 into the sources of P-channel input transistors Q1 and Q2 as their tail current $I_1$ if they are turned on as a result of the common mode input voltage $V_{CM}$ being less than Vref2. If $V_{CM}$ is greater than Vref2, then current steering transistor Q14 "steers" the current $I_P$ from cascode transistor Q13 into cascode transistor Q15 and current mirror output transistor Q16. The current $I_P$ therefore is mirrored by means of current mirror output transistor Q11 and flows through cascode transistor Q10 to produce the tail current $I_2$ in conductor 5 for N-channel input transistors Q3 and Q4.

The bias circuitry of input stage 2 in FIG. 1 operates to control tail currents $I_1$ and $I_2$ of the differential input stage including transistors Q1-4 so as to maintain the transconductance $g_m$ relatively constant over the entire common mode input voltage range from ground to $V_{DD}$. When the common mode input voltage $V_{CM}$ is less than Vref2, the current through transistor Q13 is equal to the P-channel tail current $I_1$, and the current $I_P$ is zero. When the common-mode input voltage $V_{CM}$ is high enough to exceed Vref2, the P-channel input transistors Q1 and Q2 are turned off and the resulting current $I_P$ through transistor Q13 becomes the current which is mirrored to provide an equal value of the N-channel tail current $I_2$, because current mirror transistors Q16 and Q11 typically are matched transistors. Thus, the current $I_P$ flowing to ground through transistors Q14, Q15 and Q16 plus the resulting-channel tail current $I_2$ flowing to ground when $V_{CM}$ is less than Vref2 results in roughly twice as much power being dissipated as when $V_{CM}$ is greater than Vref2.

Thus, the bias circuitry in Prior Art FIG. 1 which provides the tail currents $I_1$ and $I_2$ consumes about twice the amount of current (and power) when N-channel input transistors Q3 and Q4 are active than when P-channel input transistors Q1 and Q2 are active. Although the technique for generating tail current in FIG. 1 is very common, it is wasteful of current (and power). This is because if the circuitry of FIG. 1 is designed to optimize the speed-to-current ratio, the tail currents $I_1$ and $I_2$ are minimal compared to the rest of the current in the operational amplifier circuit. However, if the circuit of FIG. 1 is designed to optimize the noise-to-current ratio (or noise-to-power ratio), then there typically will be relatively large input tail currents, which would result in very fast amplifier operation, making it necessary to use frequency compensation techniques to reduce the speed to a normal level, since the only way to reduce the total quiescent current of the operational amplifier is to reduce the speed. That is, if the circuit of FIG. 1 is being designed to minimize the noise for a given total quiescent current, the tail current typically will be a much more significant portion of the total quiescent current for the operational amplifier, and the large value of $I_P$ that is required to generate the large value of N-channel tail current $I_2$ becomes problematic.

Thus, there is an unmet need for rail-to-rail differential input amplifier circuitry which avoids wasting bias current when a particular pair of differentially coupled input transistors is turned off.

There also is an unmet need for rail-to-rail operational amplifier circuitry which avoids wasting bias current when a particular pair of differentially coupled input transistors is turned off in the case wherein the operational amplifier circuitry is being designed for a low noise-to-current ratio.

SUMMARY OF THE INVENTION

It is an object of the invention to provide rail-to-rail differential input amplifier circuitry which avoids wasting bias current when a particular pair of differentially coupled input transistors is turned off.

It is another object of the invention to provide rail-to-rail operational amplifier circuitry which avoids wasting bias current when a particular pair of differentially coupled input transistors is turned off in the case wherein the operational amplifier circuitry is being designed for a low noise-to-current ratio.

Briefly described, and in accordance with one embodiment, the present invention provides an amplifier including first (Q1,Q2) and second (Q3,Q4) pairs of differentially coupled input transistors. The first current mirror (I3,Q6,Q8) generates a reference current ($I_R$) which is mirrored by a second current mirror (Q9,Q12) to produce a mirrored reference current ($I_P$). Current steering circuitry (Q14,Q17,Q1, Q2) steers the mirrored reference current ($I_P$) as a first tail current ($I_1$) through the first pair when a common mode voltage ($V_{CM}$) associated with a differential input voltage (Vin$^+$-Vin$^-$) exceeds a first reference voltage (Vref2). A first portion ($I_P'$) of the mirrored reference current ($I_P$) flows from the first current steering circuitry when the common mode voltage is greater than the first reference voltage to produce a second tail current ($I_2$) for the second pair. A second portion ($I_F$) of the mirrored reference current ($I_P$) is fed back to an output of the first current mirror and summed with the reference current ($I_R$) so as to reduce the second portion ($I_P'$) when the common mode voltage ($V_{CM}$) is greater than the first reference voltage (Vref2).

In one embodiment, the invention provides amplifier circuitry including first (Q1,Q2) and second (Q3,Q4) pairs of differentially coupled input transistors, each transistor having a first electrode, a second electrode, and a control electrode, a differential input voltage being coupled between the control electrodes of the first pair and also being coupled between the control electrodes of the second pair, the second electrodes of the first and second pairs of differentially coupled input transistors being coupled to a folded cascode stage (3). First current mirror circuitry (I3,Q6,Q8) generates a reference current ($I_R$), and second current mirror circuitry (Q9,Q12) receives the reference current ($I_R$) and produces a mirrored reference current ($I_P$). Current steering circuitry (Q14,Q17, Q1,Q2) operates to steer the mirrored reference current ($I_P$) as a first tail current ($I_1$) through the first electrodes of the transistors of the first pair (Q1,Q2) when a common mode input voltage ($V_{CM}$) of the amplifier circuitry exceeds a first reference voltage (Vref2). Third current mirror circuitry (Q15, Q16,Q11,Q10) receives and amplifies a first portion ($I_P'$) of the mirrored reference current ($I_P$) from the current steering circuitry (Q13) when the common mode voltage ($V_{CM}$) is less than the first reference voltage (Vref2) to produce a second tail current ($I_2$) through the first electrodes of the transistors of the second differentially coupled pair (Q3,Q4). Current feedback circuitry (Q17,Q18) receives a second portion ($I_F$) of the mirrored reference current ($I_P$) and sums the second portion ($I_F$) with the reference current ($I_R$) at an output of the first current mirror circuitry (Q6,Q8) so as to reduce the mirrored reference current ($I_P$) when the common mode voltage ($V_{CM}$) is less than the first reference voltage (Vref2).

In a described embodiment, the first pair of differentially coupled input transistors (Q1,Q2) includes P-channel first (Q1) and second (Q2) input transistors, the second pair of differentially coupled input transistors (Q3,Q4) includes N-channel third (Q3) and fourth (Q4) input transistors, and the second current mirror circuitry (Q9,Q12) includes a P-channel first current mirror control transistor (Q9) and a P-channel first current mirror output transistor (Q12), a W/L ratio (channel-width-to-channel-length ratio) of the first current mirror output transistor (Q12) being a ratio N times a W/L ratio of the first current mirror control transistor (Q9). A W/L ratio of the first current steering transistor (Q14) is a ratio M times a W/L ratio of the second current steering transistor (Q17). The third current mirror circuitry (Q15,Q16,Q11, Q10) includes a N-channel second current mirror control transistor (Q16) and a N-channel second current mirror output transistor (Q11), a W/L ratio (channel-width-to-channel-length ratio) of the second current mirror output transistor (Q11) being 1+(N+1)/M times a W/L ratio of the second current mirror control transistor (Q16) so as to cause the second tail current ($I_2$) to have the same value when the common mode voltage ($V_{CM}$) is greater than the first reference voltage (Vref2) that the first tail current ($I_1$) has when the common mode voltage ($V_{CM}$) is less than the first reference voltage (Vref2).

In a described embodiment, the current steering circuitry (Q14,Q17,Q1,Q2) includes P-channel first (Q14) and second (Q17) current steering transistors having sources coupled to sources of the first (Q1) and second (Q2) input transistors, gates of the first (Q14) and second (Q17) current steering transistors being coupled to receive the first reference voltage (Vref2), wherein the current feedback circuitry (Q17,Q18) includes the second current steering transistor (Q17), the second current steering transistor (Q17) having a gate coupled to receive the first reference voltage (Vref2). The first current mirror circuitry (I3,Q6,Q8) includes a N-channel third current mirror control transistor (Q6) and a N-channel third current mirror output transistor (Q8) having a drain coupled to a drain of the first current mirror control transistor (Q9). The current feedback circuitry (Q17,Q18) includes a N-channel diode-connected transistor (Q18) coupled between a drain of the second current steering transistor (Q17) and a summing conductor (21) coupled to a drain of the third current mirror output transistor (Q8) to cause a reduced amount of current ($I_{Q9}$) to flow through the first current mirror control transistor (Q9) when the common mode input voltage ($V_{CM}$) is greater than the first reference voltage (Vref2).

In a described embodiment, a drain of the second current mirror control transistor (Q16) is coupled to the drain of the first current steering transistor (Q14) by means of a N-channel first cascode transistor (Q15) having a gate coupled to receive a second reference voltage (Vref1), and a drain of the second current mirror output transistor (Q11) is coupled to sources of the third (Q3) and fourth (Q4) input transistors by means of a N-channel second cascode transistor (Q10) that is matched to the second current mirror output transistor (Q11). A drain of the first current mirror output transistor (Q12) is coupled to the source of the first current steering transistor (Q14) by means of a third cascode transistor (Q13) having a gate coupled to receive the first reference voltage (Vref2). In the described embodiment, a W/L ratio of the second current steering transistor (Q17) is matched to a W/L ratio of the first current steering transistor (Q14) to cause currents therein to be equal, and the ratio N is 10.

In one embodiment, the first current mirror circuitry (I3, Q5,Q6) includes a constant current source coupled to a drain of a N-channel cascode transistor (Q5) having a source coupled to a drain of the third current mirror control transistor (Q6).

In one embodiment, a balancing circuit (34) is coupled to a drain of the first current mirror control transistor (Q9) and a drain of the first current mirror output transistor (Q12).

In one embodiment, the invention provides a method of reducing waste bias current in amplifier circuitry which includes a first pair of differentially coupled input transistors (Q1,Q2), a differential input voltage (Vin$^+$-Vin$^-$) being coupled between gates of the first pair, and a second pair of differentially coupled input transistors (Q3,Q4), the differential input signal also being coupled between gates of the second pair, drains of the first and second pairs of differentially coupled input transistors being coupled to a folded-cascode stage (3), first current mirror circuitry (I3,Q6,Q8) for generating a reference current ($I_R$), second current mirror circuitry (Q9,Q12) receiving the reference current ($I_R$) and producing a mirrored reference current ($I_P$), and first current steering circuitry operative to steer the mirrored reference current ($I_P$) as a first tail current ($I_1$) through the first pair of differentially coupled input transistors (Q1,Q2) when a common mode voltage ($V_{CM}$) associated with the differential input voltage (Vin$^+$-Vin$^-$) exceeds a first reference voltage (Vref2), wherein the method includes amplifying a first portion ($I_P'$) of the mirrored reference current ($I_P$) when the common mode voltage ($V_{CM}$) is greater than the first reference voltage (Vref2) to produce a second tail current ($I_2$) for the second differentially coupled pair of transistors (Q3,Q4), feeding a second portion ($I_F$) of the mirrored reference current ($I_P$) back to an output of the first current mirror (I3,Q6, Q8) and summing the second portion ($I_F$) of the mirrored reference current ($I_P$) with the reference current ($I_R$) so as to reduce the first portion ($I_P'$) of the mirrored reference current ($I_P$) when the common mode voltage ($V_{CM}$) is greater than the first reference voltage (Vref2). In one embodiment, the method includes providing a W/L ratio (channel-width-to-channel-length ratio) of the first current mirror output transistor (Q12) equal to a ratio N times a W/L ratio of the first current mirror control transistor (Q9) and also providing a W/L ratio of the first current steering transistor (Q14) equal to a ratio M times a W/L ratio of the second current steering transistor (Q17), wherein the third current mirror circuitry (Q15,Q16,Q11,Q10) includes a N-channel second current mirror control transistor (Q16) and a N-channel second current mirror output transistor (Q11). A W/L ratio (channel-width-to-channel-length ratio) of the second current mirror output transistor (Q11) is provided to be equal to 1+(N+1)/M times a W/L ratio of the second current mirror control transistor (Q16) so as to cause the second tail current ($I_2$) to have the same value when the common mode voltage ($V_{CM}$) is greater than the first reference voltage (Vref2) that the first tail current ($I_1$) has when the common mode voltage ($V_{CM}$) is less than the first reference voltage (Vref2).

In one embodiment, the invention provides amplifier circuitry including a first pair of differentially coupled input transistors (Q1,Q2), and a second pair of differentially coupled input transistors (Q3,Q4), the differential input signal also being coupled between gates of the second pair, first current mirror circuitry (I3,Q6,Q8) for generating a reference current ($I_R$), second current mirror circuitry (Q9,Q12) receiving the reference current ($I_R$) and producing a mirrored reference current ($I_P$), current steering circuitry (Q14,Q17,Q1, Q2) operative to steer the mirrored reference current ($I_P$) as a first tail current ($I_1$) through the first pair of differentially coupled input transistors (Q1,Q2) when a common mode voltage ($V_{CM}$) associated with the differential input voltage (Vin$^+$-Vin$^-$) exceeds a first reference voltage (Vref2), and means (Q15,Q16,Q11,Q10) for amplifying a first portion ($I_P'$) of the mirrored reference current ($I_P$) when the common mode voltage ($V_{CM}$) is greater than the first reference voltage (Vref2) to produce a second tail current ($I_2$) for the second differentially coupled pair of transistors (Q3,Q4). The amplifier circuitry also includes means (Q1,Q18,21) for feeding a second portion ($I_F$) of the mirrored reference current ($I_P$) back to an output of the first current mirror (I3,Q6,Q8) and summing the second portion ($I_F$) of the mirrored reference current ($I_P$) with the reference current ($I_R$) so as to reduce the first portion ($I_P'$) of the mirrored reference current ($I_P$) when the common mode voltage ($V_{CM}$) is greater than the first reference voltage (Vref2).

BRIEF DESCRIPTION OF THE DRAWINGS

FIG. 3 is a schematic diagram of another operational amplifier including the present invention.

DETAILED DESCRIPTION OF THE PREFERRED EMBODIMENTS

Figure 2A:
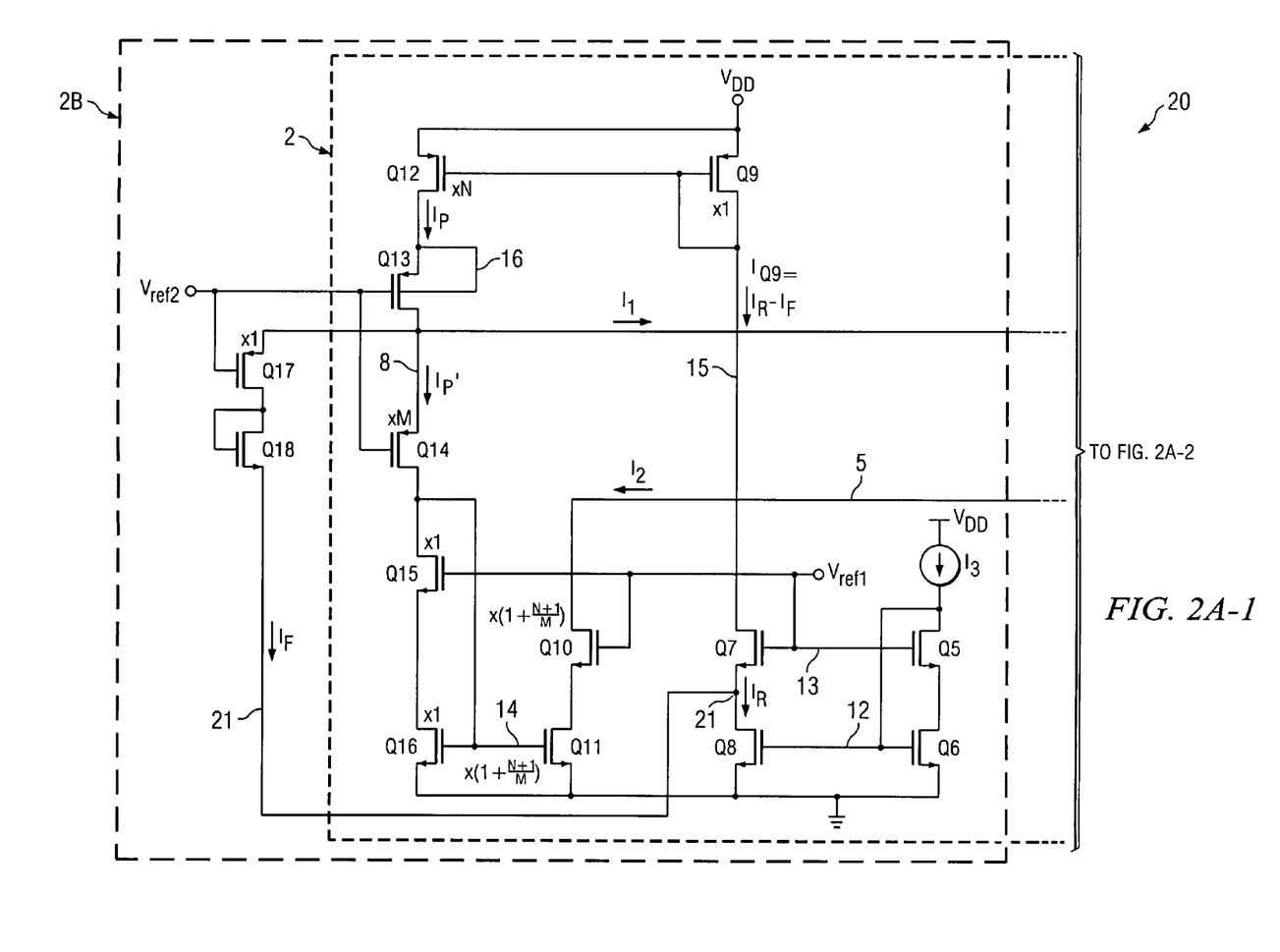
FIG. 2A is a schematic diagram of an operational amplifier including the present invention.
FIG. 2B is a simplified schematic diagram of the circuit in FIG. 2A for explaining the derivation of equations.
Figure 2A:
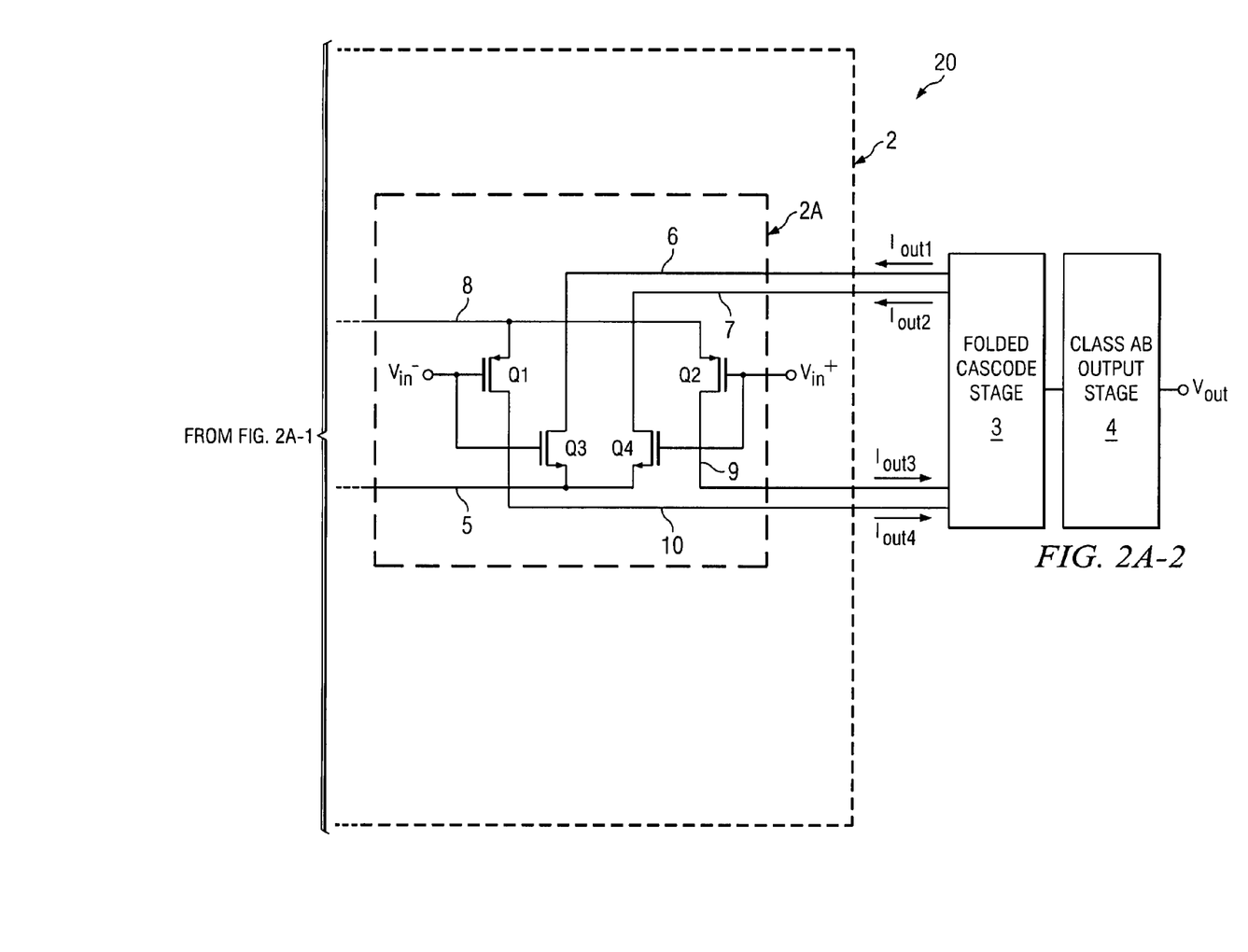

Referring to FIG. 2A, rail-to-rail operational amplifier 20 includes input stage 2, which includes two pairs of differentially coupled opposite-conductivity input transistors and circuitry for generating their associated tail currents, as in Prior Art FIG. 1. Specifically, input stage 2 includes a differential input stage 2A including a first differentially coupled pair of P-channel input transistors Q1 and Q2 having their sources connected by conductor 8 to receive tail current $I_1$, and a second differentially coupled pair of N-channel input transistors Q3 and Q4 having their sources connected by conductor 5 to receive tail current $I_2$. An input voltage Vin$^+$ is coupled to the gate electrodes of input transistors Q1 and Q3, and another input voltage Vin$^-$ is coupled to the gate electrodes of input transistors Q2 and Q4. The differential input voltage applied to operational amplifier 20 thus is equal to Vin$^+$-Vin$^-$. The drains of input transistors Q3 and Q4 are coupled by conductors 6 and 7, respectively, to two corresponding differential input terminals of conventional folded cascode stage 3, and the drains of input transistors Q1 and Q2 are coupled by conductors 10 and 9, respectively, to two other corresponding differential input terminals of folded cascode stage 3. The output of folded cascode stage 3 can be coupled to the input of a conventional class AB output stage 4. The rest of the circuitry shown in input stage 2 constitutes bias circuitry 2B which produces the two tail currents $I_1$ and $I_2$.

Conductor 8 is connected to the collector of P-channel cascode transistor Q13 and to the source of P-channel current steering transistor Q14. The gates of transistors Q13 and Q14 are connected to receive a reference voltage Vref2. The source electrode and bulk electrode of current steering transistor Q13 are connected by conductor 16 to the drain of a P-channel current mirror output transistor Q12, the source of which is connected to $V_{DD}$. The gate of current mirror output transistor Q12 is connected by conductor 15 to the gate and drain of a P-channel current mirror control transistor Q9, the source of which is connected to $V_{DD}$. The drain of transistor Q14 is connected by conductor 14 to the drain of a N-channel cascode transistor Q15 and to the gates of N-channel current mirror control transistor Q16 and current mirror output transistor Q11, the sources of which are connected to ground. The source of cascode transistor Q15 is connected to the drain of current mirror control transistor Q 16. The gate of cascode transistor Q 15 is connected by conductor 13 to receive a reference voltage Vref1. Conductor 5 conducts tail current $I_2$ into the drain of N-channel cascode transistor Q10, which has its gate connected to Vref1 and its source connected to the drain of N-channel current mirror output transistor Q11.

Conductor 15 is connected to the drain of a N-channel cascode transistor Q7 having its gate connected by conductor 13 to receive Vref1 and its source is connected by conductor 21 to the drain of N-channel current mirror output transistor Q8. The gate of current mirror output transistor Q8 is connected by conductor 12 to the gate of a N-channel current mirror control transistor Q6 and to the drain of a N-channel cascode transistor Q5. The source of current mirror control transistor Q6 is connected to ground and its drain is connected to the source of cascode transistor Q5, the gate of which is connected to Vref1. A constant current source $I_3$ is connected between conductor 12 and $V_{DD}$.

The circuitry in operational amplifier 20 of FIG. 2A differs from that of operational amplifier 1 in FIG. 1 by the addition of P-channel transistor Q 17, which has its source connected to conductor 8, its gate connected to Vref2, and its drain connected to the drain and gate of a N-channel diode-connected transistor Q 18, the source of which is connected by conductor 21 to the source of cascode transistor Q7 and the drain of current mirror output transistor Q8.

A reference current $I_R$ is generated in current mirror output transistor Q8 and flows through cascode transistor Q7, conductor 15 and current mirror control transistor Q9. This causes a corresponding current $I_P$ to flow through current mirror output transistor Q12 and current steering transistor Q13 to provide either tail current $I_1$ or the "split" currents $I_P'$ and $I_F$, depending on whether or not the common mode input voltage $V_{CM}$ exceeds Vref2. If the common mode input voltage $V_{CM}$ exceeds Vref2, then the current $I_P'$ flows through transistors Q14 and Q15 and current mirror control transistor Q16, and is mirrored and "gained up" (i.e., amplified) by a factor of N+2 (in the case where M=1) by means of current mirror output transistor Q11 to produce the tail current $I_2$ through cascode transistor Q10 as illustrated.

The function of transistor Q 17 is to split the current $I_P$ into two separate currents $I_P'$ and $I_F$, in the case wherein the common mode input voltage $V_{CM}$ exceeds Vref2 so that $I_P$ is steered into current steering transistors Q14 and Q15. Diode-connected to transistor Q18 is required so that the drain-to-source voltages of current steering transistors Q17 and Q14 are approximately equal, in order to make the above mentioned current splitting more accurate.

The transistors are sized such that the W/L ratio of current mirror output transistor Q12 is N times that of current mirror control transistor Q9, W being the channel width and L being the channel length. Current steering Q14 has a W/L ratio of M times the W/L ratio of current steering transistor Q17. Also, current mirror output transistor Q12 has a W/L ratio of 1+(N+1)/M (which is equal to N+2 in the described case wherein M=1) times that of current mirror control transistor Q16. Therefore, currents $I_P'$ and $I_F$ are split according to the ratio M, and are equal if this ratio is equal to 1. The foregoing ratios provide the result that the N-channel tail current $I_2$ is the same as the P-channel tail current $I_1$, which keeps the transconductance $g_m$ of input stage 2 relatively constant. In this way, the current $I_P$ is N times larger than the reference current, $I_R$-$I_F$. Similarly the current $I_P'$ is M times the feedback current $I_F$.

The current $I_P$ flowing through current mirror output transistor Q12 and current steering Q13 thus is split into the current $I_P'$ flowing in the current mirror control transistor Q16 and the feedback current $I_F$ flowing through transistors Q17 and Q16 and feedback conductor 21, as shown. This greatly reduces the current $I_{Q9}$=$I_R$-$I_F$ in current mirror control transistor Q9, by a factor of 1+(N+1)/M.

Figure 2B:
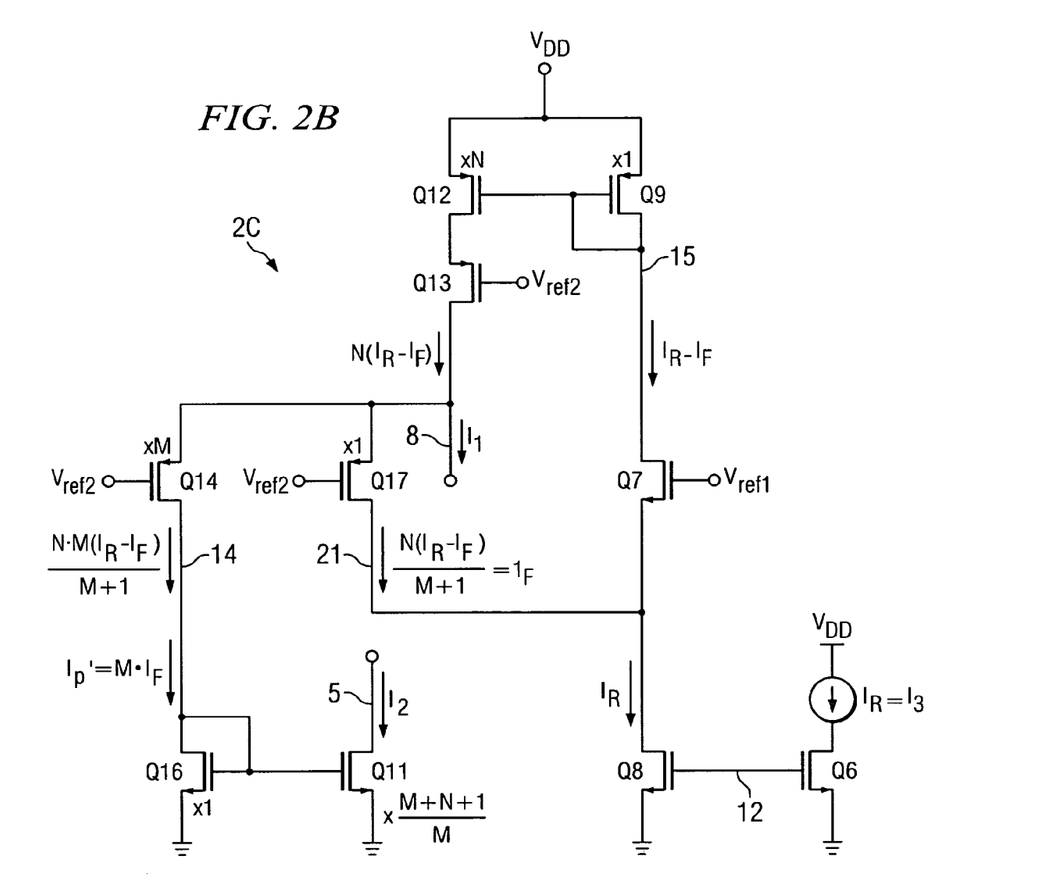

FIG. 2B shows a simplified bias circuit 2C to aid in understanding the equations that explain the operation of bias circuit 2B in FIG. 2A. Bias circuit 2C in FIG. 2B is essentially the same as bias circuit 2B in FIG. 2A except that cascode transistors Q5, Q10, and Q15 and diode-connected transistor Q 18 have been omitted for simplicity.

As indicated in FIG. 2B, the amount of current that flows through current mirror output transistor Q8 and conductor 15 is equal to $I_R$ if feedback current $I_F$ is zero, but is equal to $I_R$-$I_F$ if feedback current $I_F$ is non-zero. Consequently, the current through current mirror control transistor Q9 is $I_R$-$I_F$. Since the W/L ratio of current mirror output transistor Q12 is N times that of current mirror input transistor Q9, the current flowing through transistors Q12 and Q13 is N ($I_R$-$I_F$). If this current is steered into P-channel input transistors Q1 and Q2 (FIG. 2A) because the common mode voltage $V_{CM}$ is less than Vref2, then the feedback current $I_F$ is zero. Therefore, in this case the P-channel tail current $I_1$ is equal to N×$I_R$.

However, if the current through transistors Q12 and Q13 is steered into transistors Q14 and Q17 because the common mode input voltage $V_{CM}$ is greater than Vref2, then that current is split between transistors Q14 and Q17 in the ratio M to 1. That is, the current $I_F$ through transistor Q17 is given by the equation:

$$I_F = \frac{N(I_R - I_F)}{M+1}. \qquad \text{Equation (1)}$$

From this, it can be shown that $$I_P' = \frac{N \times M(I_R - I_F)}{M+1}. \qquad \text{Equation (2)}$$

From Equation (2) it can be shown that $$I_F = \frac{N \times I_R}{M+N+1}. \qquad \text{Equation (3)}$$

From FIG. 2B it is apparent, from the current splitting according to the relative W/L ratios of transistors Q14 and Q17, that the following equation applies:

$$I_P' = M \times I_F. \qquad \text{Equation (4)}$$

Substituting Equation (3) into Equation (4) results in:

$$I_P' = \frac{N \times M \times I_R}{M+N+1}. \qquad \text{Equation (5)}$$

Since the magnitude of the P-channel tail current $I_1$ is equal to N×$I_R$ and also is equal to the magnitude of the N-channel tail current $I_2$, this leads to:

$$I_P' = \frac{M \times I_2}{M+N+1}. \qquad \text{Equation (6)}$$

Therefore, in the case wherein M is chosen to be equal to 1 and N is selected to be equal to 10, the W/L ratio of transistor Q11 must be equal to 12 times that of transistor Q16.

In order to reduce the amount of "wasted" bias current $I_P'$ in input stage 2, the "effective" reference current $I_{Q9}$=$I_R$-$I_F$ through current mirror control transistor Q8 has to be reduced so it can be mirrored through upper current mirror Q9,Q12 and then mirrored and gained up through lower current mirror Q16,Q11 when $V_{CM}$ is greater than Vref2. If N is about 10, the current $I_{Q9}$=$I_R$-$I_F$ through transistor Q9 in FIG. 2A is much smaller than the current through transistor Q9 in Prior Art FIG. 1.

The improvement of operational amplifier 20 in FIG. 2A is accomplished by splitting $I_P$ through transistor Q13 so that only half of it (assuming M=1) flows as the current $I_P'$ through transistors Q14, Q15, and Q16 and the other half flows through transistors Q17 and Q18 as the feedback current $I_F$ which is fed back into conductor 21. The resulting current summing causes a substantial reduction in the "effective reference current" $I_{Q9}=I_R-I_F$ flowing through current mirror control transistor Q9. The reduced "effective reference current" $I_{Q9}=I_R-I_F$ then is "mirrored around" and "gained up" by the ratio N+2 of current mirror control transistor Q16 to produce the N-channel tail current $I_2$.

When the common mode voltage, $V_{CM}$, is less than Vref2, the mirrored reference current $I_P$ flows entirely into the sources of Q1 and Q2. Therefore, all of reference current $I_R$ flows through current mirror control transistor Q9. When the common mode voltage $V_{CM}$ is greater than Vref2, then transistors Q1 and Q2 turn off, and the reference current, $I_P$, is split equally into $I_F$ and $I_P'$. The feedback current $I_F$ causes the "effective" reference current $I_R-I_F$ to be reduced. This in turn causes $I_P'$ to be reduced. In order to establish the correct tail current $I_2$, $I_P'$ is amplified by a factor of N+2 (in the case wherein M=1) through the current mirror defined by transistors Q16 and Q11. Using this biasing scheme, the current $I_P'$ that is wasted is only a small fraction of that which is wasted in the operational amplifier 1 of Prior Art FIG. 1.

Specifically, the resulting reduced amount of effective reference current $I_{Q9}$ required to generate tail current $I_2$ results in the large reduction in the "wasted" current associated with $I_P$ of Prior Art FIG. 1 when $V_{CM}$ is greater than Vref2. Transistor Q13 and its gate voltage Vref2 control when the tail current flows through the P-channel or the N-channel input transistors in response to the common mode input voltage $V_{CM}$. The feedback of $I_F$ reduces the value of $I_{Q9}=I_R-I_F$, which also reduces $I_P'$, which is mirrored and gained up to provide tail current $I_2$. For a given tail current $I_2$, the "wasted" current $I_P'$ is $M/(M+N+1)\times I_2$. With N equal to 10 and M equal to 1, a 12-fold reduction in wasted current is achieved.

Thus, the above described tail current generating circuitry and bias current feedback technique results in "wasting" of only a small fraction of the amount of bias current inherently wasted in the input stage circuitry of the prior art, for example as shown in FIG. 1.

In order to further increase the accuracy of this circuit, a balancing circuit can be used in the upper current mirror Q9,Q12 as shown in operational amplifier 30 of FIG. 3. Operational amplifier 30 of FIG. 3 is essentially the same as operational amplifier 20 of FIG. 2A, with the further balancing circuitry 34 as shown. Balancing circuitry 34 includes P-channel transistor Q19 having its source connected to conductor 16, its drain connected by conductor 32 to one terminal of current source $I_6$, one terminal of a compensation capacitor C, and the gate of a P-channel transistor Q20. The source of transistor Q20 is connected to conductor 15, and its drain is connected by conductor 31 to one terminal of a current source $I_7$ and the other terminal of compensation capacitor C. The other terminals of current sources $I_6$ and $I_7$ are connected to ground. Current source $I_4$ is connected between $V_{DD}$ and conductor 16, and current source $I_5$ is connected between $V_{DD}$ and conductor 15. The current sources I4 and I5 are matched to balance the currents in the left portion Q12,Q19,$I_6$ and the right portion Q9,Q20,$I_7$ of balancing circuit 34.

Balancing circuit 34 functions to keep the tail currents $I_1$ and $I_2$ constant as transistor Q9 begins to saturate, by making the upper current mirror Q9,Q12 more accurate. Balancing circuit 34 also keeps the drain voltages of transistors Q9 and Q12 constant so that there is no modulation of tail currents $I_1$ and $I_2$ as $V_{DD}$ changes. That results in the more constant tail current, which results in more constant bandwidth and noise-to-current ratio and in better common mode rejection (CMR), and also provides a slight improvement in voltage headroom.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the basic technique and structure of the invention is applicable to a bipolar transistor implementation.

What is claimed is:

1. Amplifier circuitry comprising:
   (a) first and second pairs of differentially coupled input transistors, each transistor having a first electrode, a second electrode, and a control electrode, a differential input voltage being coupled between the control electrodes of the first pair and also being coupled between the control electrodes of the second pair, the second electrodes of the first and second pairs of differentially coupled input transistors being coupled to a folded cascode stage;
   (b) first current mirror circuitry for generating a reference current;
   (c) second current mirror circuitry receiving the reference current and producing a mirrored reference current;
   (d) current steering circuitry operative to steer the mirrored reference current as a first tail current through the first electrodes of the transistors of the first pair when a common mode input voltage of the amplifier circuitry exceeds a first reference voltage;
   (e) third current mirror circuitry receiving and amplifying a first portion of the mirrored reference current from the current steering circuitry when the common mode voltage is less than the first reference voltage to produce a second tail current through the first electrodes of the transistors of the second differentially coupled pair; and
   (f) current feedback circuitry receiving a second portion of the mirrored reference current and summing the second portion with the reference current at an output of the first current mirror circuitry so as to reduce the mirrored reference current when the common mode voltage is less than the first reference voltage.

2. The amplifier circuitry of claim 1 wherein the first pair of differentially coupled input transistors includes P-channel first and second input transistors, the second pair of differentially coupled input transistors includes N-channel third and fourth input transistors, and wherein the second current mirror circuitry includes a P-channel first current mirror control transistor and a P-channel first current mirror output transistor, a W/L ratio (channel-width-to-channel-length ratio) of the first current mirror output transistor being a ratio N times a W/L ratio of the first current mirror control transistor.

3. The amplifier circuitry of claim 2 wherein a W/L ratio of the first current steering transistor is a ratio M times a W/L ratio of the second current steering transistor.

4. The amplifier circuitry of claim 3 wherein the third current mirror circuitry includes a N-channel second current mirror control transistor and a N-channel second current mirror output transistor, a W/L ratio (channel-width-to-channel-length ratio) of the second current mirror output transistor being 1+(N+1)/M times a W/L ratio of the second current mirror control transistor so as to cause the second tail current to have the same value when the common mode voltage is greater than the first reference voltage that the first tail current has when the common mode voltage is less than the first reference voltage.

5. The amplifier circuitry of claim 3 wherein the current steering circuitry includes P-channel first and second current steering transistors having sources coupled to sources of the first and second input transistors, gates of the first and second current steering transistors being coupled to receive the first reference voltage, and wherein the current feedback circuitry includes the second current steering transistor, the second current steering transistor having a gate coupled to receive the first reference voltage.

6. The amplifier circuitry of claim 5 wherein the first current mirror circuitry includes a N-channel third current mirror control transistor and a N-channel third current mirror output transistor having a drain coupled to a drain of the first current mirror control transistor.

7. The amplifier circuitry of claim 6 wherein the current feedback circuitry includes a N-channel diode-connected transistor coupled between a drain of the second current steering transistor and a summing conductor coupled to a drain of the third current mirror output transistor to cause a reduced amount of current to flow through the first current mirror control transistor when the common mode input voltage is greater than the first reference voltage.

8. The amplifier circuitry of claim 7 wherein a drain of the second current mirror control transistor is coupled to the drain of the first current steering transistor by means of a N-channel first cascode transistor having a gate coupled to receive a second reference voltage, and wherein a drain of the second current mirror output transistor is coupled to sources of the third and fourth input transistors by means of a N-channel second cascode transistor that is matched to the second current mirror output transistor.

9. The amplifier circuitry of claim 8 wherein a drain of the first current mirror output transistor is coupled to the source of the first current steering transistor by means of a third cascode transistor having a gate coupled to receive the first reference voltage.

10. The amplifier circuitry of claim 5 wherein a W/L ratio of the second current steering transistor is matched to a W/L ratio of the first current steering transistor to cause currents therein to be equal.

11. The amplifier circuitry of claim 10 wherein the ratio N is 10.

12. The amplifier circuitry of claim 1 wherein an output of the folded cascode stage is coupled to an input of a class AB output stage.

13. The amplifier circuitry of claim 6 wherein the first current mirror circuitry includes a constant current source coupled to a drain of a N-channel cascode transistor having a source coupled to a drain of the third current mirror control transistor.

14. The amplifier circuitry of claim 2 including a balancing circuit coupled to a drain of the first current mirror control transistor and a drain of the first current mirror output transistor.

15. A method of reducing waste bias current in amplifier circuitry including
    i. a first pair of differentially coupled input transistors, a differential input voltage being coupled between gates of the first pair, and a second pair of differentially coupled input transistors, the differential input signal also being coupled between gates of the second pair, drains of the first and second pairs of differentially coupled input transistors being coupled to a folded-cascode stage,
    ii. first current mirror circuitry for generating a reference current,
    iii. second current mirror circuitry receiving the reference current and producing a mirrored reference current, and
    iv. first current steering circuitry operative to steer the mirrored reference current as a first tail current through the first pair of differentially coupled input transistors when a common mode voltage associated with the differential input voltage exceeds a first reference voltage, the method comprising:
    (a) amplifying a first portion of the mirrored reference current when the common mode voltage is greater than the first reference voltage to produce a second tail current for the second differentially coupled pair of transistors; and
    (b) feeding a second portion of the mirrored reference current back to an output of the first current mirror and summing the second portion of the mirrored reference current with the reference current so as to reduce the first portion of the mirrored reference current when the common mode voltage is greater than the first reference voltage.

16. The method of claim 15 wherein the amplifier circuitry of claim 1 wherein the first pair of differentially coupled input transistors includes P-channel first and second input transistors, the second pair of differentially coupled input transistors includes N-channel third and fourth input transistors, and wherein the second current mirror circuitry includes a P-channel first current mirror control transistor and a P-channel first current mirror output transistor, the method including providing a W/L ratio (channel-width-to-channel-length ratio) of the first current mirror output transistor equal to a ratio N times a W/L ratio of the first current mirror control transistor and also providing a W/L ratio of the first current steering transistor equal to a ratio M times a W/L ratio of the second current steering transistor, wherein the third current mirror circuitry includes a N-channel second current mirror control transistor and a N-channel second current mirror output transistor, the method including providing a W/L ratio (channel-width-to-channel-length ratio) of the second current mirror output transistor equal to 1+(N+1)/M times a W/L ratio of the second current mirror control transistor so as to cause the second tail current to have the same value when the common mode voltage is greater than the first reference voltage that the first tail current has when the common mode voltage is less than the first reference voltage.

17. Amplifier circuitry comprising:
    (a) a first pair of differentially coupled input transistors, a differential input voltage being coupled between gates of the first pair, and a second pair of differentially coupled input transistors, the differential input signal also being coupled between gates of the second pair, drains of the first and second pairs of differentially coupled input transistors being coupled to a folded cascode stage;
    (b) first current mirror circuitry for generating a reference current;
    (c) second current mirror circuitry receiving the reference current and producing a mirrored reference current;
    (d) current steering circuitry operative to steer the mirrored reference current as a first tail current through the first pair of differentially coupled input transistors when a common mode voltage associated with the differential input voltage exceeds a first reference voltage;

(e) means for amplifying a first portion of the mirrored reference current when the common mode voltage is greater than the first reference voltage to produce a second tail current for the second differentially coupled pair of transistors; and (f) means for feeding a second portion of the mirrored reference current back to an output of the first current mirror and summing the second portion of the mirrored reference current with the reference current so as to reduce the second portion of the mirrored reference current when the common mode voltage is greater than the first reference voltage.

18. The amplifier circuitry of claim 17 wherein the amplifier circuitry of claim 1 wherein the first pair of differentially coupled input transistors includes P-channel first and second input transistors, the second pair of differentially coupled input transistors includes N-channel third and fourth input transistors, and wherein the second current mirror circuitry includes a P-channel first current mirror control transistor and a P-channel first current mirror output transistor, a W/L ratio (channel-width-to-channel-length ratio) of the first current mirror output transistor being equal to a ratio N times a W/L ratio of the first current mirror control transistor and a W/L ratio of the first current steering transistor being equal to a ratio M times a W/L ratio of the second current steering transistor, wherein the third current mirror circuitry includes a N-channel second current mirror control transistor and a N-channel second current mirror output transistor, a W/L ratio (channel-width-to-channel-length ratio) of the second current mirror output transistor being equal to $1+(N+1)/M$ times a W/L ratio of the second current mirror control transistor so as to cause the second tail current to have the same value when the common mode voltage is greater than the first reference voltage that the first tail current has when the common mode voltage is less than the first reference voltage.

* * * * *